(12) United States Patent
Levy et al.

(10) Patent No.: US 12,167,575 B1
(45) Date of Patent: Dec. 10, 2024

(54) LASER-WELDED COOLING PLATE

(71) Applicant: STAFL Systems, LLC, South San Francisco, CA (US)

(72) Inventors: Benjamin Michael Levy, Oakland, CA (US); Andrew Kenji McIntosh, San Francisco, CA (US); Erik Stafl, Eugene, OR (US)

(73) Assignee: STAFL SYSTEMS, LLC, South San Francisco, CA (US)

( * ) Notice: Subject to any disclaimer, the term of this patent is extended or adjusted under 35 U.S.C. 154(b) by 0 days.

(21) Appl. No.: 18/524,996

(22) Filed: Nov. 30, 2023

Related U.S. Application Data

(63) Continuation of application No. 18/384,316, filed on Oct. 26, 2023.

(51) Int. Cl.
| | |
|---|---|
| *H05K 7/20* | (2006.01) |
| *B32B 3/26* | (2006.01) |
| *B32B 3/30* | (2006.01) |
| *B32B 15/01* | (2006.01) |

(52) U.S. Cl.
CPC ........... *H05K 7/2039* (2013.01); *B32B 3/266* (2013.01); *B32B 3/30* (2013.01); *B32B 15/016* (2013.01); *B32B 2307/7376* (2023.05); *B32B 2457/00* (2013.01)

(58) Field of Classification Search
CPC ... B32B 3/30; B32B 3/266; B32B 2310/0843; B32B 15/016; B32B 2307/7376; B32B 2457/00; H05K 7/20327; H05K 7/2039
See application file for complete search history.

(56) References Cited

U.S. PATENT DOCUMENTS

| | | | | |
|---|---|---|---|---|
| 11,731,220 | B2 * | 8/2023 | Huang | F28D 15/0233 |
| | | | | 29/890.032 |
| 2003/0106799 | A1 * | 6/2003 | Covington | B29C 66/929 |
| | | | | 204/600 |
| 2014/0202628 | A1 * | 7/2014 | Sreetharan | B32B 37/144 |
| | | | | 156/290 |
| 2014/0231055 | A1 * | 8/2014 | Schalansky | B23P 15/26 |
| | | | | 29/890.039 |
| 2016/0263703 | A1 * | 9/2016 | Eldred | B23K 26/244 |
| 2020/0388844 | A1 * | 12/2020 | Richey | H01M 4/96 |
| 2023/0243606 | A1 * | 8/2023 | Minamitani | B32B 7/12 |
| | | | | 165/166 |

* cited by examiner

*Primary Examiner* — Gordon A Jones
(74) *Attorney, Agent, or Firm* — Brad Bertoglio; Intelink Law Group, P.C.

(57) ABSTRACT

The present invention relates to a cooling plate for thermal management of a system such as an electronic. A unitary, single-material cooling plate can be formed from three stacked flat aluminum sheets, including a top sheet, a bottom sheet, and a middle sheet. An open channel is formed in the middle sheet by laser cutting, and enclosed by the top and bottom sheets. The top and bottom sheets are secured to the middle sheet through continuous laser welds applied around the circumference of the open channel and laser welding applied around the outer perimeter of the cooling plate. Flow modifiers or sensor assemblies may be encapsulated within the middle sheet open channel. The open channel may, in some embodiments, constitute a single open coolant chamber, with islands of material positioned therein and welded to the top and bottom sheets. Methods for manufacture of such cooling plates are also disclosed.

15 Claims, 13 Drawing Sheets

LASER-WELDED COOLING PLATE

RELATED APPLICATIONS AND CLAIM OF PRIORITY

This patent application is a Continuation Patent Application of and claims priority to U.S. patent application Ser. No. 18/384,316 filed on Oct. 26, 2023, entitled LASER-WELDED COOLING PLATE.

BACKGROUND

1. Field of the Invention

This invention relates generally to the field of thermal management systems, and more specifically, to an improved, cost-effective, and versatile cooling plate design that ensures effective and reliable cooling of various applications, including but not limited to, large format battery packs.

2. Description of the Related Art

The recent advances in technology have led to an increased need for effective cooling solutions. Specifically, applications such as battery packs in electric vehicles, CPUs, and other power electronics devices require efficient heat management to ensure proper function and extend their life.

One traditional cooling solution involves the use of a cooling plate secured to a power electronic device (preferably via a thermally-conductive interface). Some cooling plates may include a channel through which a coolant fluid may be circulated, to extract heat energy from a device being cooled. Cooling plates with circulating coolant are typically composed of multiple layers and materials, including gaskets for sealing. A common example of such a plate is an aluminum core with a CNC-cut serpentine coolant channel extending from one end of the core to an opposite end. Solid top and bottom plates are attached to top and bottom surfaces of the core, respectively, to enclose the coolant channel, with gaskets interposed between the layers to prevent leakage of coolant fluid.

However, these traditional solutions have their limitations. For instance, gaskets may be prone to blowout. To reduce risk of gasket blowout, relatively thicker top and bottom plates may be necessary, increasing weight and cost of the assembled plate. Also, the core, top plate, bottom plate and/or gaskets may be formed from differing materials. Differences in the thermal coefficient of expansion between different materials used can lead to failure over time, due to the stresses that develop as the materials expand and contract differently in response to heating and cooling. In some applications, such as cooling of high-power, large-format battery systems in electric vehicles, cooling system failure can lead to a variety of undesirable outcomes including catastrophic failure of the underlying systems, resulting in substantial damage and potentially harm to the safety of individuals.

Moreover, existing cooling solutions often involve complex manufacturing processes, which are costly and can limit the geometrical versatility of the design. For instance, traditional solutions involve CNC machining, which can be a relatively costly process (particularly at production volumes) and may limit a particular production facility to a particular design for which a CNC machine is configured.

Some cooling plate designs involve use of vacuum brazed plates to secure multiple plates together by heating a braze alloy between assembled components, where the braze alloy has a lower melting point than the assembled components. Such vacuum brazing processes may provide strong joints with good thermal conductivity between assembled components. However, brazing processes introduce multiple different materials into a system, which further complicates the manufacturing process and limits geometrical design. Vacuum brazing processes may also introduce certain limitations in part geometry.

Another conventional approach involves roll bonding. Two sheets (typically formed of aluminum) are welded together under high heat and pressure. A paste or silkscreen pattern is applied between the plates before welding, to prevent the plates from bonding in certain areas. The unbonded channels between the plates can then be pressurized to deform the plates by inflating the channels, resulting in a cooling plate with a unique pillow-shaped channel structure.

Lastly, the issue of plate strength and integrity is a significant challenge with the traditional solutions. Particularly for cooling plates formed from multiple layers with gaskets in between, the top and bottom plates may be prone to deformation causing "blow outs". To reduce such occurrences, a relatively heavier top and/or bottom plate must be used, adding to the overall weight of the system.

Thus, there is a need for a highly performant cooling plate that may overcome some or all of the above-mentioned limitations: one that ensures coolant integrity, can be manufactured in a scalable and cost-effective manner, provides design versatility, is lightweight, and maintains structural integrity and strength.

SUMMARY

A cooling plate for thermal management of an electronic system or device is provided, along with methods for manufacturing such a cooling plate. In accordance with one aspect, a unitary cooling plate component of a single material may be formed from three stacked sheets of material, preferably an aluminum such as 3003-series aluminum alloy. The sheets include a top sheet, a bottom sheet, and a middle sheet. In some embodiments, the top sheet and the bottom sheet are each 0.5 mm to 1.5 mm in thickness; and the middle sheet has a thickness in excess of 1.5 mm. The middle sheet includes an open channel through which coolant fluid may flow, traversing an interior portion of the middle sheet in e.g. a serpentine pattern. The open channel may be formed via a laser cutting process, and solid portions of the top sheet and the bottom sheet enclose the middle sheet open channel. The top sheet and the bottom sheet are each secured to the middle sheet via: (a) one or more continuous laser welds applied around the circumference of the open channel on the top and bottom sides; and (b) laser welding applied around the outer perimeter of the cooling plate on the top and bottom sides. During fabrication, the continuous welds may be formed from multiple overlapping weld sections.

In some aspects, the middle sheet may include various geometries to control flow of coolant through the open channel, including one or more laser-cut radiused turns and baffles within the open channel. Additionally or alternatively, flow modifiers such as portions of expanded aluminum may be inserted into the open channel during assembly, to further promote coolant mixing within the open channel. Additionally or alternatively, the top and/or bottom sheets may be formed from textured aluminum sheeting, with a textured surface that may face inward toward the open channel to further reduce boundary layers in coolant passing through the open channel.

In some aspects, the techniques described herein relate to a cooling plate, which further includes an electronic device to which the cooling plate is secured during operation, whereby coolant can be passed through the open channel in order to remove thermal energy from the electronic device.

In some aspects, the techniques described herein relate to a cooling plate, further including an inlet port providing open communication between a first end of the open channel and an area outside the cooling plate, and an outlet port providing open communication between a second end of the open channel and an area outside the cooling plate; whereby coolant may be introduced through the inlet port, passed through the middle sheet open channel, and evacuated from the outlet port.

In some aspects, the techniques described herein relate to a cooling plate, further including a sensor assembly within the open channel. The sensor assembly may include one or more sensors (such as temperature sensors) mounted on a flexible PCB, the flexible PCB extending along at least a portion of the open channel. The sensors may include multiple temperature sensors spaced along the PCB, whereby temperature at different locations within the open channel may be monitored. A near field communications transmitter or transceiver may be included in the sensor assembly to enable transmission of sensor data to a control system outside the cooling plate.

In some aspects, the techniques described herein relate to a method for manufacturing a cooling plate including: forming an open channel through a middle sheet of material by laser cutting and removal of a portion of the sheet corresponding to the open channel; stacking within a fabrication fixture a top sheet of material on a first side of the middle sheet, and a bottom sheet of material on a second side of the middle sheet opposite the first side, such that the top sheet and the bottom sheet enclose the open channel; applying a plurality of laser welds to the stacked sheets, forming: a top side perimeter laser weld around a circumference of the cooling plate to secure the top sheet to the middle sheet, a bottom side perimeter laser weld around a circumference of the cooling plate to secure the bottom sheet to the middle sheet, a top side channel laser weld around a circumference of the open channel to secure the top sheet to the middle sheet, and a bottom side channel laser weld around a circumference of the open channel to secure the bottom sheet to the middle sheet. In such methods, the top sheet, the middle sheet and the bottom sheet may consist of aluminum, such as a series 3003 aluminum alloy.

In some aspects, the fabrication fixture may include a pressure plate and clamps, and wherein the step of stacking includes using the clamps to compress the stacked top sheet, middle sheet and bottom sheet against the pressure plate. The pressure plate may be formed from aluminum, and act to sink thermal energy from the cooling plate during the step of applying a plurality of laser welds. Different, interchangeable pressure plates (which may, e.g., expose different portions of the stacked sheets) may be utilized to apply different welds, e.g. a first pressure plate may be used to apply the perimeter laser welds, and a second pressure plate may be used to apply the channel laser welds.

In some aspects, the method may include insertion of one or more coolant flow modifier components or sensor assemblies within the middle sheet open channel during fabrication of the cooling plate.

In some aspects, the techniques described herein relate to a method that includes forming apertures within the top sheet for an inlet port providing communication between a first end of the open channel and an area outside the cooling plate, and for an outlet port providing communication between a second end of the open channel and an area outside the cooling plate. Inlet and outlet ports may be attached to the top layer e.g. by welding.

In some aspects, the techniques described herein relate to a method, further including forming apertures aligned with one another in the top sheet, middle sheet and bottom sheet which do not expose any portion of the open channel, for mounting of the cooling plate to a device.

In some aspects, a single large coolant chamber may be formed in the middle layer, spanning a large portion (e.g. in some embodiments at least 80%) of the length and width of the middle layer. Islands of material may be distributed throughout the coolant chamber and attached to the top and bottom layers. The islands may be cylindrical in shape having a height equal to that of the middle layer, and distributed throughout the coolant chamber in a polka dot pattern.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Disclosed is a laser-welded cooling plate and method for manufacturing such a cooling plate. A cooling plate may be formed from three stacked flat sheets of material such as an aluminum alloy, cut and welded entirely using lasers. Such an approach may enable the efficient and versatile manufacture of a unitary cooling plate component formed from a single uniform material, for thermal management of electronic devices or systems to which the cooling plate may be mounted.

Figure 1:
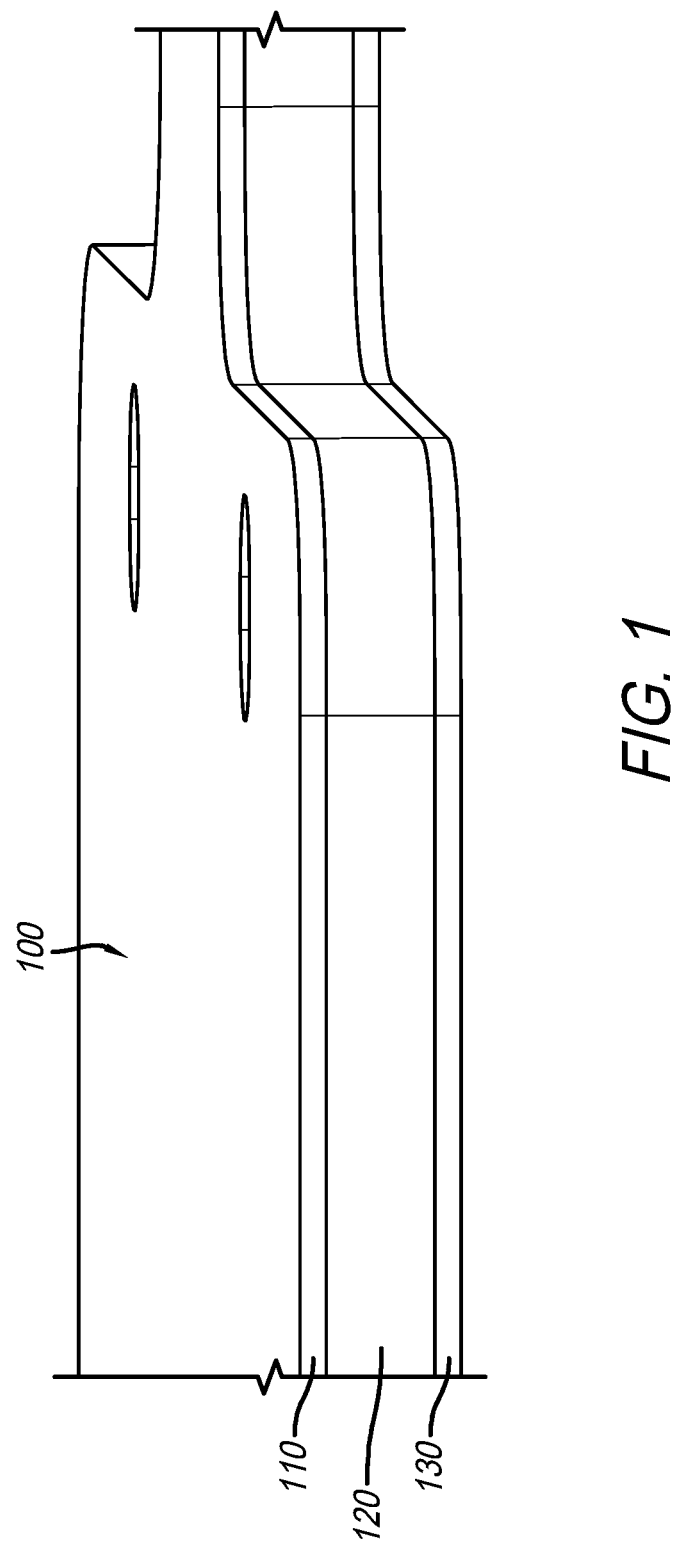
FIG. 1 is a cutaway perspective view of a cooling plate, in accordance with an embodiment.

For example, FIG. 1 provides a perspective cutaway view of cooling plate 100, formed from top sheet 110, middle sheet 120 and bottom sheet 130. References herein to "top" and "bottom" are intended to provide relative references to various components and geometries disclosed herein, with the understanding that the assembled cooling plate may be ultimately utilized in any orientation as desired for a particular application. Each of top sheet 110, middle sheet 120 and bottom sheet 130 are preferable formed from identical materials, such as aluminum. As used herein, the term "aluminum" without more is intended to encompass both pure aluminum and aluminum alloys, although it is contemplated and understood that typically aluminum alloys will be most desirable. Preferably, 3003-series aluminum alloys may be utilized for top sheet 110, middle sheet 120 and bottom sheet 130, as such material has been found to be particularly effective in maintaining structural integrity and other desirable characteristics when laser welded in the disclosed structure.

Figure 2:
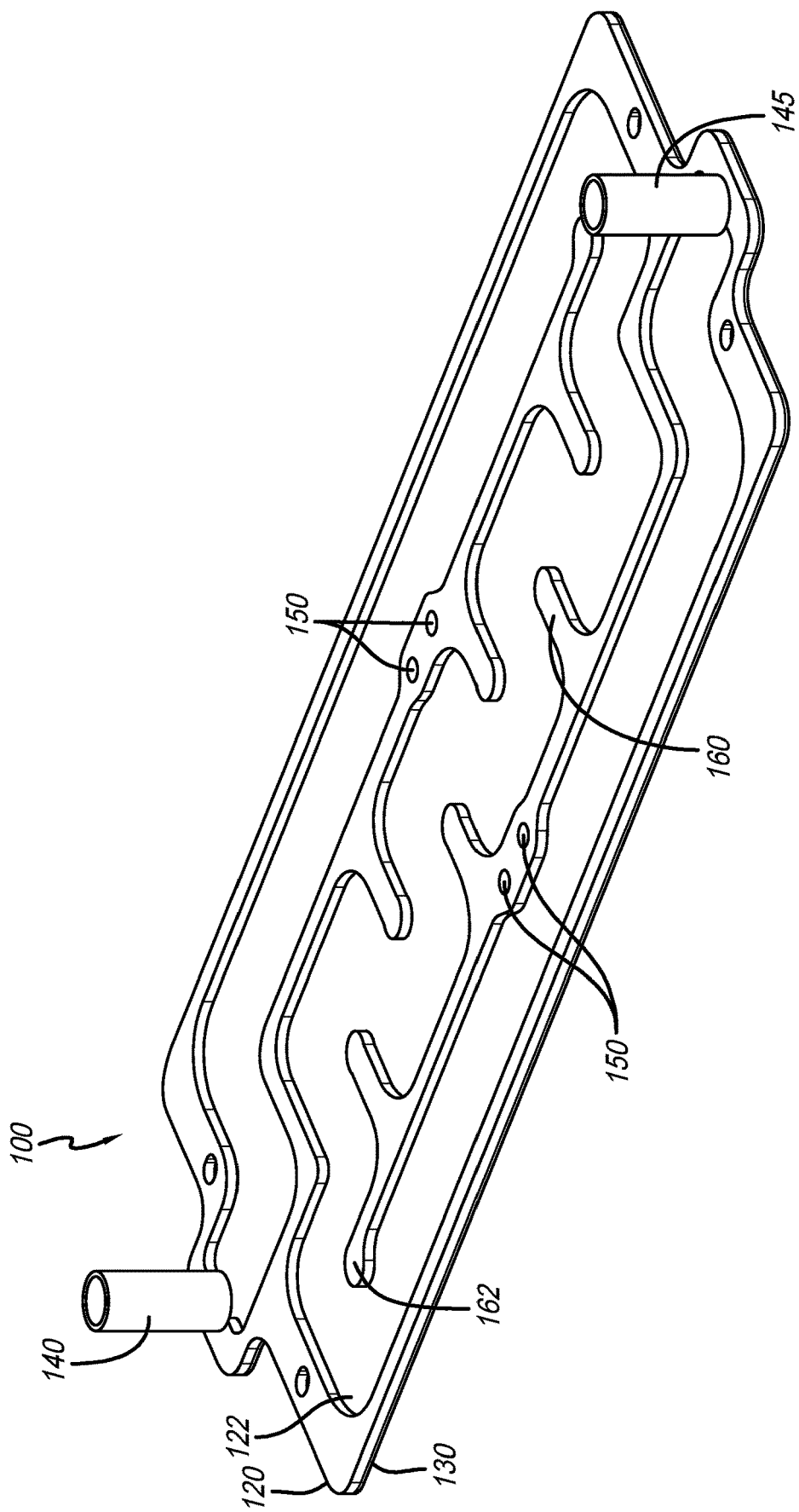
FIG. 2 is a perspective view of a cooling plate, with top sheet removed.

FIG. 2 illustrates a perspective view of cooling plate 100, in which top sheet 110 has been removed, revealing details of middle sheet 120. An open channel 122 is formed in middle sheet 120. Channel 122 may extend from one end of cooling plate 100 to an opposite end thereof, preferably traversing an interior portion of the middle sheet in a single continuous serpentine channel. The pathway of channel 122 may be configured at least in part based upon the geometry of a system on which cooling plate 100 is to be installed, such that channel 122 traverses portions of cooling plate 100 which will be mounted proximate portions of a battery system or other electronic system from which heat energy is to be removed.

Channel 122 may be created within a solid sheet of material via a laser cutting process, via which a laser is used to cut along the borders of channel 122 such that a portion of the middle sheet material within channel 122 can be removed. Such laser cutting processes may enable extremely high-resolution geometries for channel 122, as well as flexible on-demand and on-site manufacturing processes. For example, insofar as a laser cutting pattern may be software-defined, a single fabrication station may be utilized to produce middle layers having varying geometry, in any sequence on demand, without retooling. As such, the majority of component cost may be attributable to raw materials, and parts can be effectively manufactured in both small and large quantities. Arbitrary, high-resolution geometries that may be formed within middle sheet 120 using a laser cutting process also facilitates formation of geometries in middle sheet 120 and channel 122 intended for turbulence control and/or improved flow of coolant fluids passing therethrough, such as baffle 160 or radiused turn 162.

When top sheet 110 and bottom sheet 130 are mounted onto middle sheet 120, top sheet 110 and bottom sheet 130 enclose channel 122 to form a continuous channel through which coolant may be circulated. As used herein, references to the top sheet and the bottom sheet enclosing the channel are intended to convey that the assembly forms an elongated channel through which coolant may flow in a constrained pathway within the cooling plate, but permits various openings such as inlet and outlet ports for introduction of coolant into cooling plate 100 and evacuation of coolant out of cooling plate 100. For example, port 140 may be formed proximate one end of channel 122 (e.g. by welding port 140 to top sheet 110 at the position of an inlet aperture in top sheet 110 exposing a first end of channel 122) to provide open communication between an area outside cooling plate 100 and a first end of middle sheet open channel 122. Similarly, port 145 may be formed proximate an opposite end of channel 122 (e.g. by welding port 145 to top sheet 110 at a position of an outlet aperture in top sheet 110 exposing a second end of channel 122 opposite the first end) to provide open communication between an area outside cooling plate 100 and a second end of middle sheet open channel 122. Port 140 and port 145 may therefore be used as inlet and outlet ports for circulation of coolant through cooling plate 100 (e.g. introduction of coolant through port 140 into channel 122, circulation of coolant through channel 122, and evacuation of coolant from port 145).

Other ports and geometries may be formed within top sheet 110 and bottom sheet 130 provided that top sheet 110 and bottom sheet 130 are substantially solid and continuous in portions of the sheets that, when assembled, enclose channel 122 of middle sheet 120. For example, mounting holes 150 may be formed within top sheet 110, middle sheet 120 and bottom sheet 130 in positions such that holes in each sheet are aligned with one another upon assembly, and which do not expose any portion of channel 122 to areas outside the cooling plate, in order to facilitate mounting of the cooling plate onto a device or system with which the cooling plate will be used.

Figure 3:
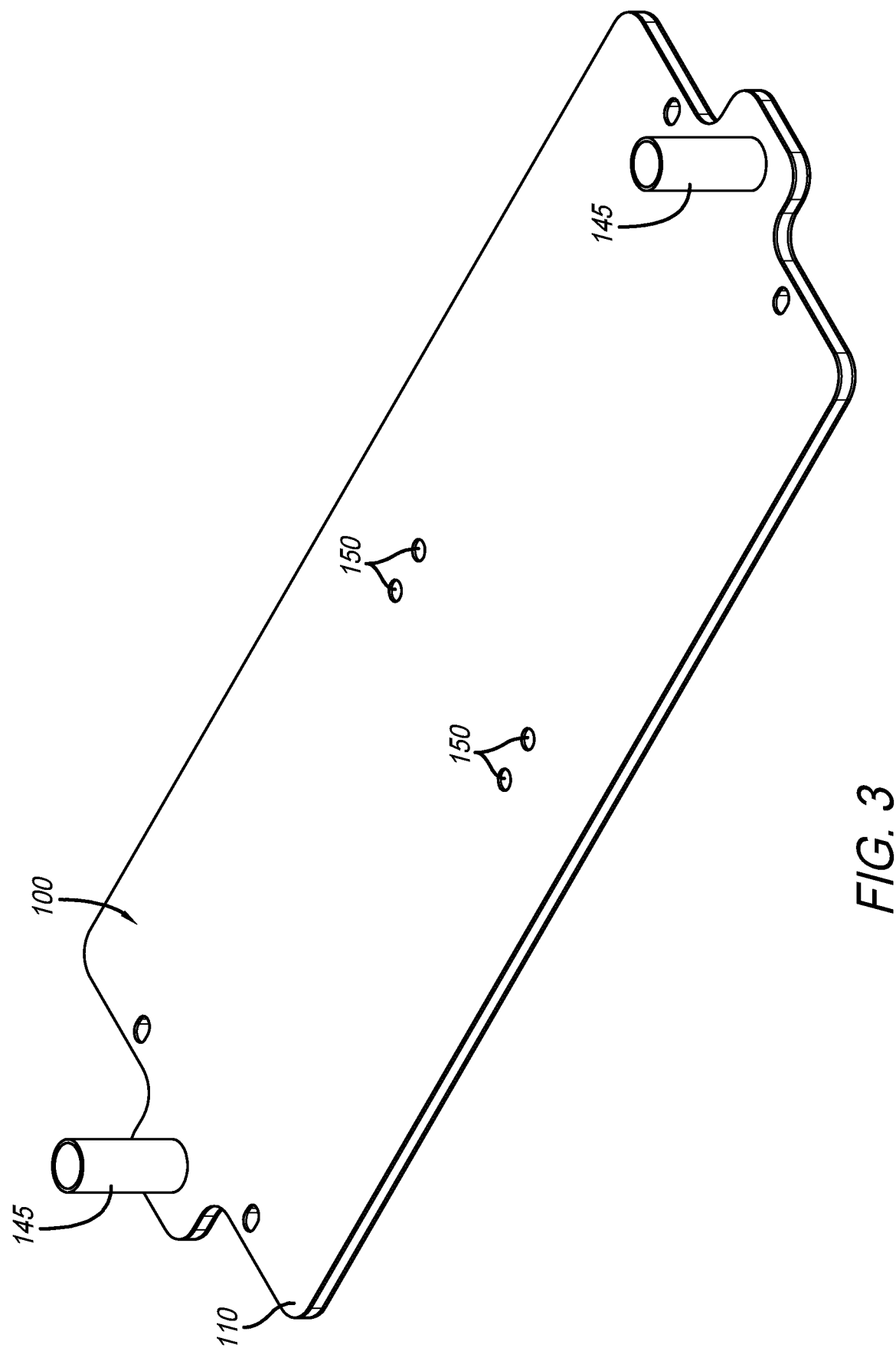
FIG. 3 is a perspective view of a cooling plate.

FIG. 3 illustrates a perspective view of cooling plate 100, as illustrated in FIG. 2, but with bottom sheet 130 installed.

Figure 4:
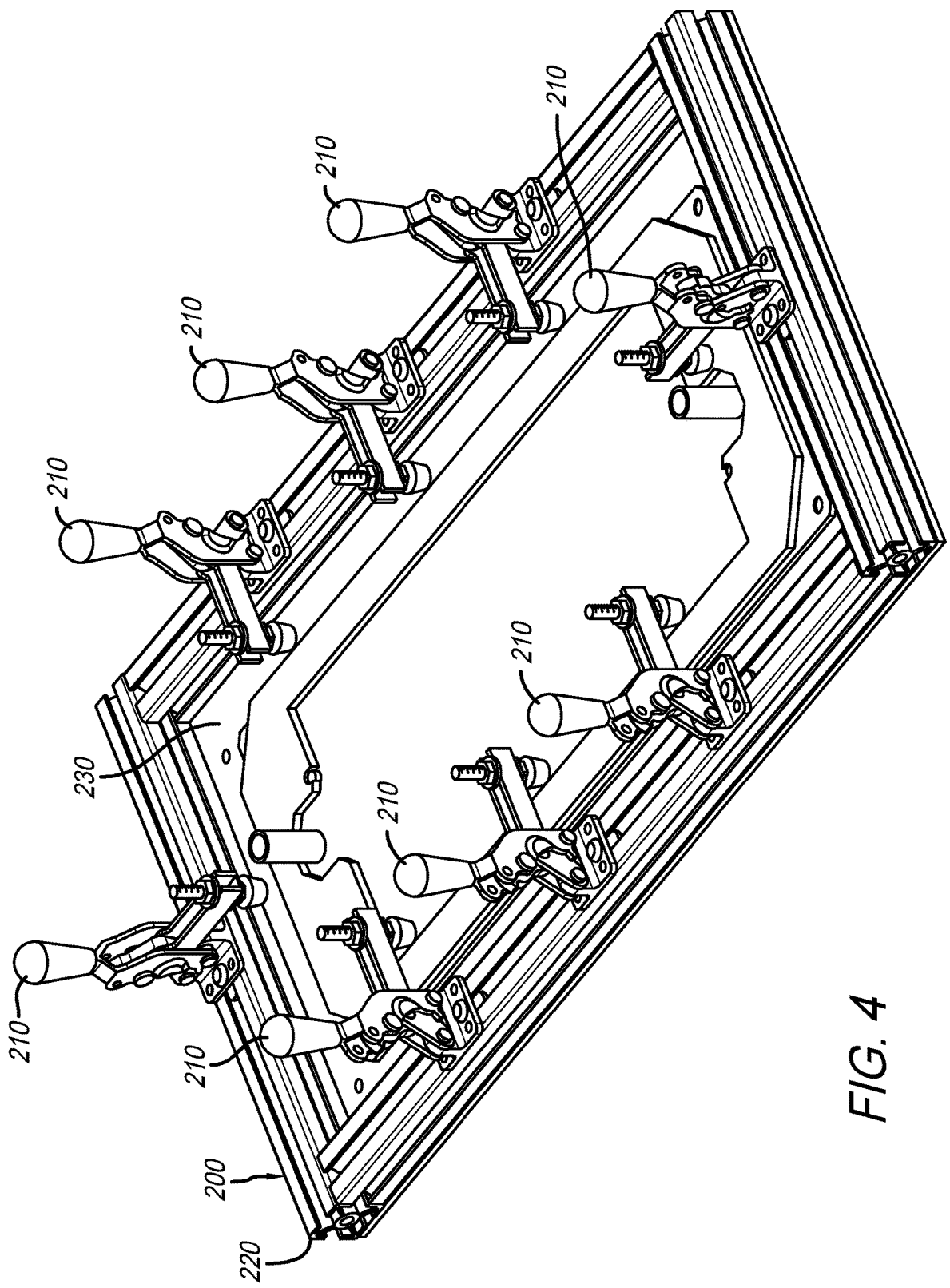
FIG. 4 is a perspective view of a cooling plate secured within a fixture for welding.

FIG. 4 is a perspective view of cooling plate 100, mounted within a fabrication fixture 200. Fabrication fixture 200 may be utilized in connection with initial fabrication, or repair, of cooling plate 100.

Figure 7:
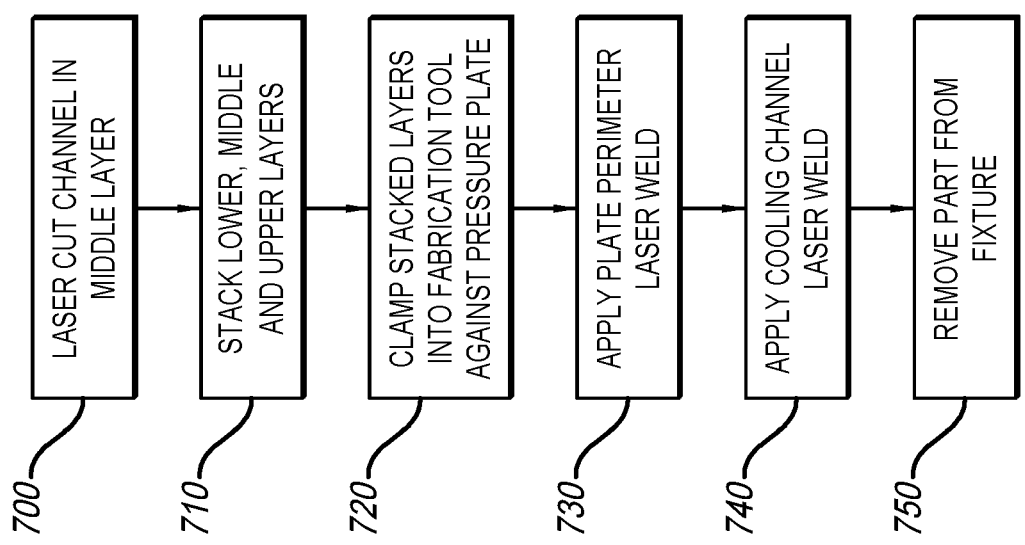
FIG. 7 is a flowchart showing a method for cooling plate fabrication.

An exemplary process for fabrication of cooling plate 100 using fabrication fixture 200 is illustrated in FIG. 7. In step S700, middle sheet 120 is fabricated by cutting channel 122 from a solid sheet of material via laser cutting, as described hereinabove. Other apertures or geometries within middle sheet 120 (e.g. mounting holes) may also be formed. In step S710, top sheet 110, middle sheet 120 and bottom sheet 130 are stacked within fabrication fixture 200.

Fabrication fixture 200 includes multiple clamps 210 secured to frame 220. In step S720, top sheet 110, middle sheet 120 and bottom sheet 130 are secured within fabrication fixture 200, with multiple clamps 210 applying compression to the stacked sheets to hold them in an aligned configuration against an aluminum pressure plate 230. During subsequent welding steps, fabrication fixture 200 and pressure plate 230 may serve to not only maintain the sheets in a desired position relative to one another and a laser welding apparatus, but also to sink some of the heat energy added to the sheet material during the welding process and help prevent overheating or warping of the sheet stock.

In some embodiments, multiple different aluminum pressure plate 230 may be utilized during fabrication. For example, a first pressure plate could be utilized during application of continuous perimeter laser weld 300 in step S730, having a large opening for welder access to the full perimeter of cooling plate 100. A second pressure plate could be utilized during application of continuous channel laser weld 310 in step S740, having smaller openings providing welder access to the area of continuous channel laser weld 310 but otherwise providing greater coverage of cooling plate 100 (for, e.g., greater physical stability, compression and heat sinking). Another benefit of an interchangeable pressure plate 230 is that, coupled with software-defined laser welding, a single fabrication station may be utilized to fabricate numerous different cooling plate piece parts and different channel geometries, without custom tooling. Such a process can enable very high equipment and/or utilization great flexibility for economically fabricating small runs of parts.

Figure 5:
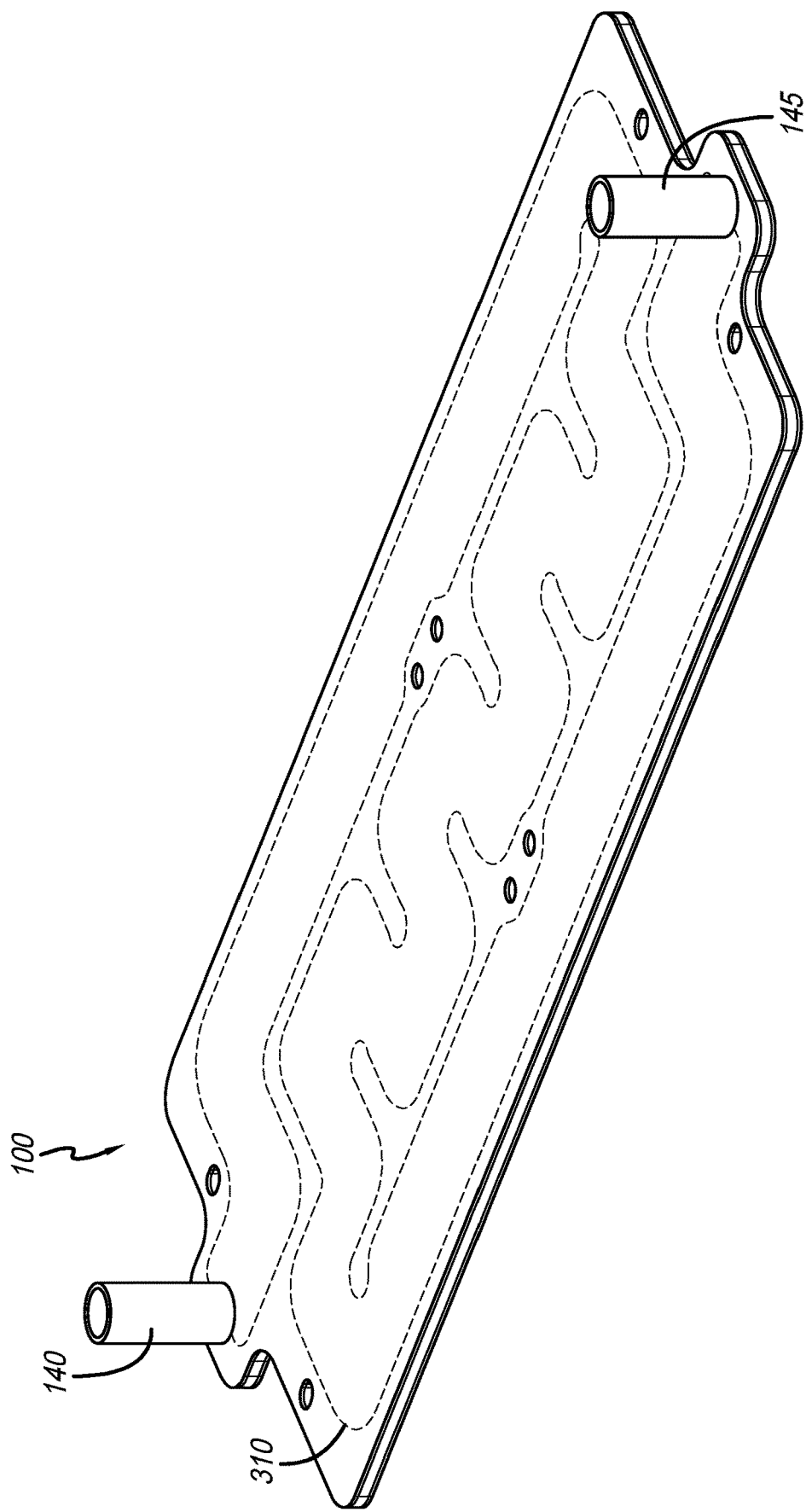
FIG. 5 is a schematic perspective view of a cooling plate illustrating laser weld lines applied during fabrication.

Once the stacked sheets are positioned, a laser welding machine may be utilized to bond them together into an integral unit. FIG. 5 provides a schematic illustration of preferred welding patterns, illustrated with respect to top sheet 110. The same weld patterns may be applied to bottom sheet 130, on the opposing side of cooling plate 100.

In particular, preferably, a continuous perimeter laser weld 300 is applied around the perimeter of cooling plate 100 in step S730, and a continuous channel laser weld 310 is applied around the perimeter of channel 122 in step S740. Top side welds, namely continuous perimeter laser weld 300 and continuous channel laser weld 310, secure top sheet 110 to middle sheet 120, and serve to seal channel 122 as it traverses cooling plate 100. Analogous bottom side continuous laser welds around the cooling plate perimeter and around the perimeter of channel 122 operate to secure bottom sheet 130 to middle sheet 120. In some embodiments, fabrication fixture 200 may be configured to permit flipping of cooling plate 100 for interchangeable access to top and bottom sides, such that top side welds and bottom side welds can be applied without removing cooling plate 100 from fabrication fixture 200. In other embodiments, after applying welds to one side of cooling plate 100, it may be necessary to remove cooling plate 100 from fabrication fixture 200 in order to flip cooling plate 100 within fabrication fixture 200 and provide access to the opposite side for welding.

For illustrative purposes, FIG. 7 shows application of continuous perimeter laser weld 300 (in step S730) to both top and bottom sides, followed by application of continuous channel laser weld 310 (in step S740) to both top and bottom sides. However, in other embodiments, it may be desirable to apply all top side welds, prior to flipping cooling plate 100 for application of all bottom side welds. These and other orders of operation can be employed in connection with the present disclosure.

Continuous perimeter laser weld 300 is illustrated as extending around the entire circumference of cooling plate 100, and such a construction may be highly desirable to e.g. avoid introduction of moisture, dirt or other materials between sheets of the assembled part. However, it is understood that in other embodiments, a cooling plate within the scope of the disclosure may be assembled without the perimeter laser weld being continuous around the entire perimeter of the cooling plate. For example, one or more gaps in the weld may be permitted. Alternatively or additionally, where for example a mounting hole is provided proximate the perimeter of a cooling plate, the perimeter laser weld may divert towards an interior portion of the cooling plate, around such a mounting hole; in such an example, a mounting bolt passing through the mounting hole and an associated mounting nut may compress the sheets sufficiently to avoid introduction of any undesired materials between sheets of the cooling plate.

In some embodiments, particularly depending upon the geometry of cooling plate 100 and channel 122, it may also be desirable to apply other welds that are neither perimeter welds nor channel welds, e.g. for additional strength or to prevent warping, sheet separation or introduction of detritus between sheets. For example, welds may be applied around mounting hole geometries, such as mounting holes 150.

While illustrated in FIG. 5 as dashed lines for illustration purposes, preferably continuous perimeter laser weld 300 and continuous channel laser weld 310 are continuous along their length. As used herein, the term "continuous weld" refers to a weld in which the welded portion of the sheets forms a continuous path when the welding operation is completed. However, it is contemplated and understood that during fabrication, it may be desirable to apply a laser welding process in multiple section welds that overlap with one another to form a continuous weld path upon completion. Applying the weld in overlapping sections, with time for heat dissipation between sections, may help avoid undesired heating, and possibly warping, of the bulk raw material. The potential for warping, particularly for aluminum sheets, may be exacerbated with reduced thickness of sheet material, so such a multi-section welding process may be particularly desirable for relatively thin welded unibody constructions.

It has been found that use of a continuous channel laser weld 310 around the perimeter of channel 122, coupled with continuous perimeter laser weld 300 around the perimeter of cooling plate 100, may provide a construction capable of withstanding high blow-out pressures, preventing coolant fluid from jumping between discontinuous portions of channel 122, and providing overall high levels of strength and rigidity of cooling plate 100, with a cost-effective and easy-to-manufacture fabrication.

Use of a laser welding process for continuous perimeter laser weld 300 and continuous channel laser weld 310 is also beneficial in that such a process does not require use of gaskets, a welding rod or other filler material, such that the entirety of cooling plate 100 can be formed from a single material. Use of a single material, amongst other things, permits the entirety of cooling plate 100 to be formed from a material having a single coefficient of thermal expansion, providing improved resistance to physical degradation when exposed to repeated heating and cooling cycles. Use of a single material also eliminates concerns with galvanic interfaces between components of differing composition.

Once the welding process is complete, the fabricated cooling plate 100 may be removed from fabrication fixture 200 (step S750).

Preferably, top sheet 110 and bottom sheet 130 will be formed from material having a thickness specified to, inter alia: (1) provide sufficient physical strength to resist physical deformation, and to resist blow-out, under tended operating conditions; (2) minimize weight and material usage; and (3) facilitate laser welding. Because the sheets are laser-welded together, the thickness of top sheet 110 and bottom sheet 130 may be reduced as compared to, e.g., constructions using gaskets for which sufficient sheet thickness may be integral to gasket performance. Accordingly, the unibody welded construction of cooling plate 100 may permit substantially thinner cooling plate geometries as compared to conventional alternatives.

In some embodiments, top sheet 110 and bottom sheet 130 will be formed from a sheet of aluminum alloy having a thickness of 0.040 inches, or 1.0 mm. In other embodiments, depending on desired design specifications, the thickness of top sheet 110 and bottom sheet 130 may each be in the range of 0.020 to 0.060 inches, or 0.5 mm to 1.5 mm. That said, while such thicknesses have been found to provide a desirable balance of material strength, susceptibility to reliable laser welding and assembled part weight, it is understood that other thicknesses for the top and bottom sheet may be used.

The thickness of middle sheet 120 may vary based upon desired design specifications, but will typically be greater than the thickness of the top sheet and middle sheet (e.g. greater than 1.5 mm thick). A thickness of material for middle sheet 120 may be selected based upon, inter alia, the desired cross-sectional area for channel 122, weight considerations, and physical size and rigidity constraints for cooling plate 100. For example, in an exemplary embodiment of system a battery cooling plate application, wherein the top sheet and bottom sheet thickness is 1 mm, the middle sheet thickness may be 4 mm. In some embodiments, it may be desirable to provide a middle sheet having a thickness in the range of ⅛" (or 3.125 mm) to 1" (or 6.35 mm). One factor that may be considered in evaluating a lower limit of middle sheet thickness is the viscosity of coolant with which the cooling plate is intended for use. Middle sheet thicknesses in the range of 2 mm or less may significantly impede the flow of common coolant fluids and reduce cooling plate effectiveness. One constraint to be considered for the upper end of cooling plate thickness is limitations on reliable laser cutting processes, as well as overall weight of the assembled plate. Middle plate thicknesses significantly in excess of the preferred ranges may be difficult or impossible to cut using typical laser cutting processes, requiring use of an alternative water jet or CNC cutting process, while providing only marginal improvements in cooling effectiveness and significant increases in material utilization and weight (due to both increased metal and increased volume of coolant contained within the plate during operation).

Figure 6:
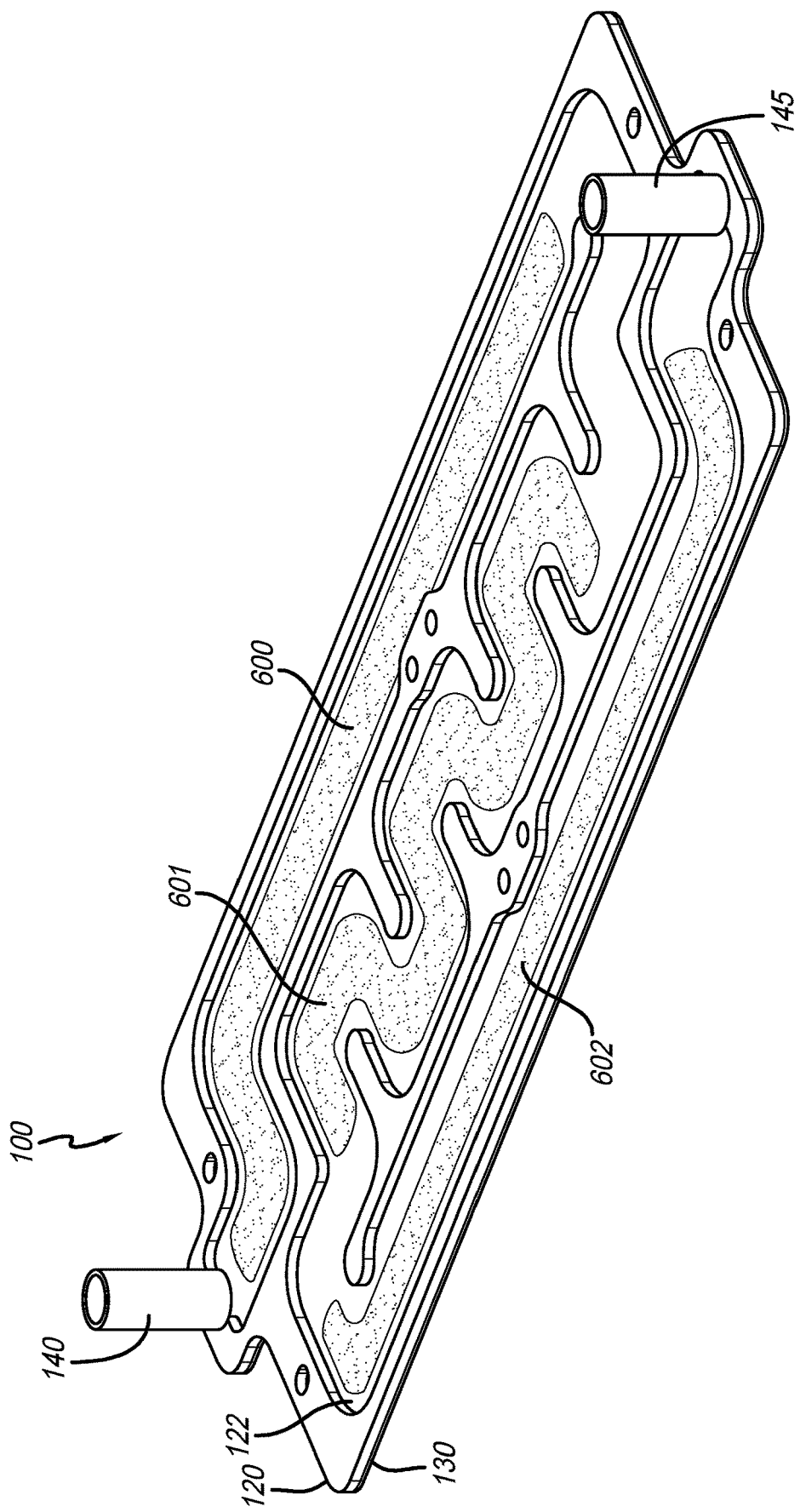
FIG. 6 is a top perspective view of a cooling plate, with top sheet removed, having expanded aluminum components within the coolant channel.

In some embodiments, it may be desirable to include other components within channel 122. FIG. 6 illustrates one such embodiment, in cutaway view with top sheet 110 removed, in which flow modifier components 600-602 are utilized to modify flow of coolant through the cooling plate. Component 600, component 601 and component 602 are each portions of expanded aluminum having a thickness less than that of middle sheet 120, inserted into portions of channel 122 during the process of stacking sheets in step S710. During subsequent operation, component 600, component 601 and component 602 each act to increase turbulence of coolant while flowing through channel 122, reducing boundary layers within the coolant fluid and improving heat transfer between cooling plate 100 and coolant flowing through channel 122. In some embodiments, component 600, component 601 and component 602 will be formed from the same material as top sheet 110, middle sheet 120 and bottom sheet 130 (e.g. an aluminum series 3003 alloy), set "loose" within channel 122 during assembly prior to placement of top sheet 110, and shaped such that the components will be retained within a given portion of channel 122 and not dislodged in response to the flow of coolant (e.g. using shapes which curve around bends within channel 122 and cannot be readily dislodged or pushed through channel 122 once top sheet 110 and bottom sheet 130 are welded in place). By forming component 600, component 601 and component 602 from the same material as top sheet 110, middle sheet 120 and bottom sheet 130, potential issues caused by galvanic interfaces and varying thermal expansion can be avoided.

In other embodiments, either or both of top sheet 110 and bottom sheet 130 may be formed from a textured aluminum sheet, particularly with a textured surface facing inwards towards middle sheet 120. For purposes of this disclosure, a sheet with textured surface will still be considered a flat sheet, provided the bulk of the sheet material is substantially coplanar. In such embodiments, portions of top sheet 110 and bottom sheet 130 exposed to channel 122 may be textured to promote improved turbulence and reduced boundary layers in coolant fluid passing through channel 122. Such textured sheets may be used as an alternative to, or in addition to, placement of components such as component 600 within channel 122. Use of textured aluminum sheets for top sheet 110 and bottom sheet 130 may also provide improved rigidity of the assembled structure.

Cooling plate embodiments described herein may be beneficially utilized in a variety of applications. For example, cooling plate 100 may be mounted to a high-power battery pack in order to facilitate cooling of the battery pack during periods of high current output. However, other embodiments could be utilized for other applications, large and small, including cooling of CPUs or other integrated circuits.

In some applications, it may be desirable to fabricate electronic subsystems within the cooling plate. The present cooling plate design and fabrication method is particularly suited for such arrangements, because channel 122 is fully exposed for insertion of sensors or subsystems prior art attachment of the final/top sheet. Additionally, laser cutting of channel 122 facilitates fabrication of fine geometries for e.g. mounting of internal subsystem components. Also, attachment of top sheet 110 and bottom sheet 130 via laser welding (possibly with significant heat sinking into an aluminum assembly fixture pressure plate) permits limited and highly controlled heating of cooling plate 100 during fabrication, thereby minimizing risk of damaging subsystem components due to heat.

Figure 8:
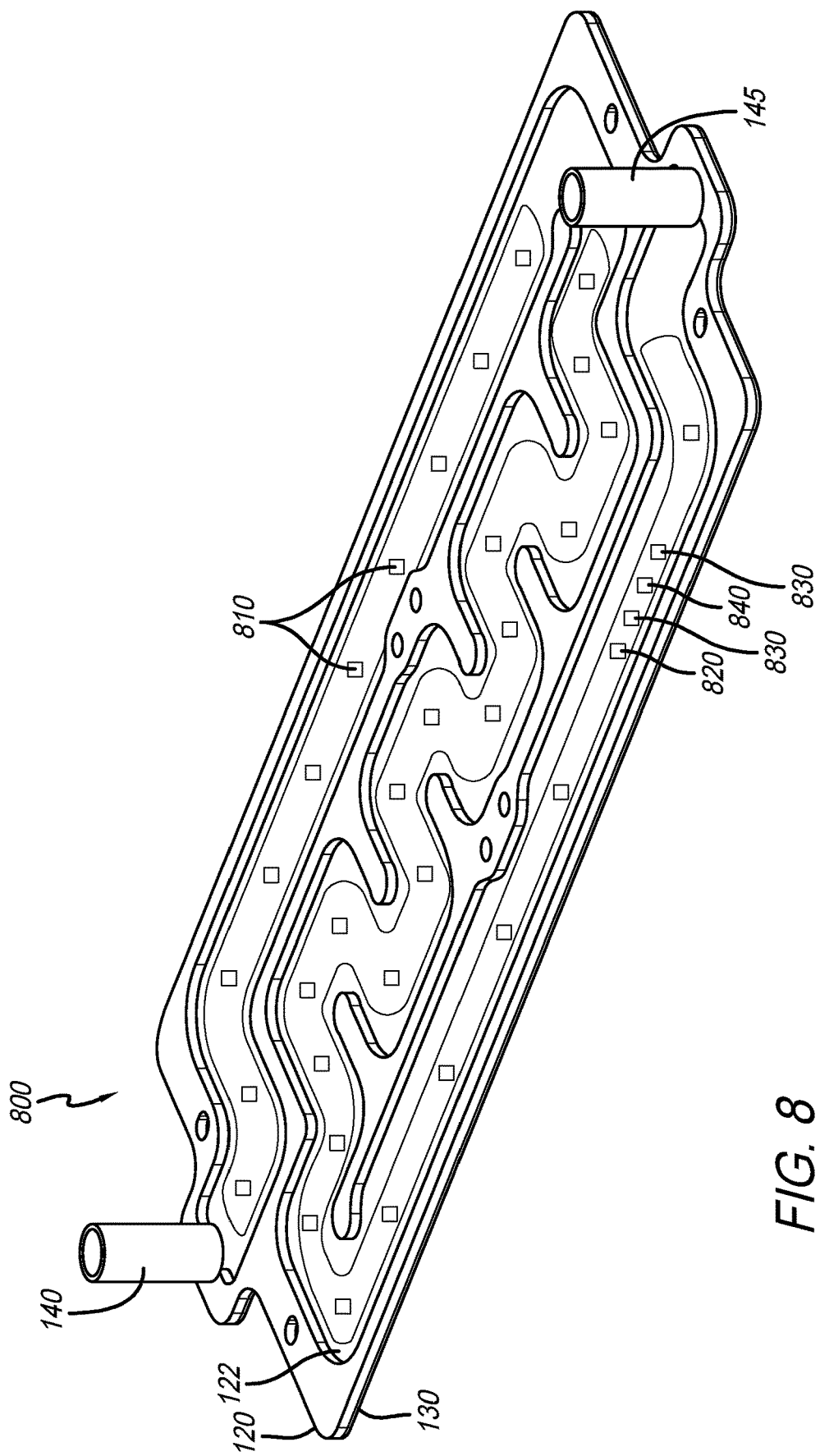
FIG. 8 is a top perspective view of a cooling plate, with top sheet removed, having a sensor assembly installed within the coolant channel.

FIG. 8 illustrates a cooling plate 800 incorporating a sensor subsystem within channel 122, with top sheet 110 removed. During assembly of cooling plate 800 (e.g. during step S710 of the method of FIG. 7), a sensor assembly formed from a flexible printed circuit board, PCB 810, is laid within channel 122. PCB 810 includes a plurality of sensors 820 mounted at spaced intervals along its length. The width of channel 122 and the thickness of middle sheet 120 are sized to permit desired area for coolant fluid flow over and around PCB 810 during operation. In addition to providing integrated sensing functionality, PCB 810 and components mounted thereon may further act to introduce turbulence in coolant fluid when circulated through channel 122, thereby reducing boundary layers and increasing heat transfer between cooling plate 100 and coolant flowing through channel 122.

In some embodiments, sensors 820 may include temperature sensors, enabling monitoring of coolant temperate at localized positions throughout the length of channel 122. In addition to generally monitoring temperatures at different locations throughout cooling plate 100, plurality of sensors 820 may enable detection of e.g. air bubbles within coolant. Particularly in applications such as high-power battery systems for electric vehicles, such coolant bubbles may cause an inverter to blow. Placement of sensors directly within the coolant channel 122 may enable an associated system controller to rapidly detect the bubble position and shut down power system components as the bubble passes.

Sensors 820 may additionally or alternatively include pressure sensors, flow rate sensors, coolant impurity sensors, or others.

Such an embodiment could provide a cooling plate that is not only formed from an extremely lightweight, structurally sturdy, unibody construction, but also a "smart plate" providing active monitoring of cooling plate operation during use.

Electrical interconnects between PCB 810 and e.g. a power source and/or external control systems, may be provided via wiring passing from PCB 810 within channel 122, up through port 140 and/or port 145, or via other access points that may be provided. In other embodiments, PCB 810 may include an onboard power source 830, such as a fixed battery or a self-charging power source which may utilize characteristics of its operating environment to recharge an onboard battery (e.g. based on coolant flow or heat); in which case, PCB 810 may further incorporate a near field communications transceiver 840 (or minimally transmitter) to enable transmission of sensor data and other interactions with external control systems via near field communications (NFC), while maintaining a fully-sealed coolant chamber. The unitary, laser-welded construction described herein enables use of particularly thin top sheet 110 and/or bottom sheet 130, which in turn enables RF/NFC transmission of data directly through top sheet 110 or bottom sheet 130.

Another aspect of the construction described herein is that the cooling plates may be repairable. With traditional fabrication techniques, such as a tooled process or pressure weld bonding, cracks or failures in a part are typically not susceptible to repair. However, if a leak is found in cooling plate 100, the cooling plate 100 may be placed back in a fixture (such as fabrication fixture 200, in step S720), and the component can be re-welded via the same laser welding steps S730 and/or S740 (or portions thereof applicable to an area in which a leak is detected or suspected). Such a repair procedure may be particularly useful during a manufacturing process, to increase yield of completed and successfully-tested parts and to avoid having to discard parts which fail to pass tests such as leak tests or pressure tests.

Figure 9:
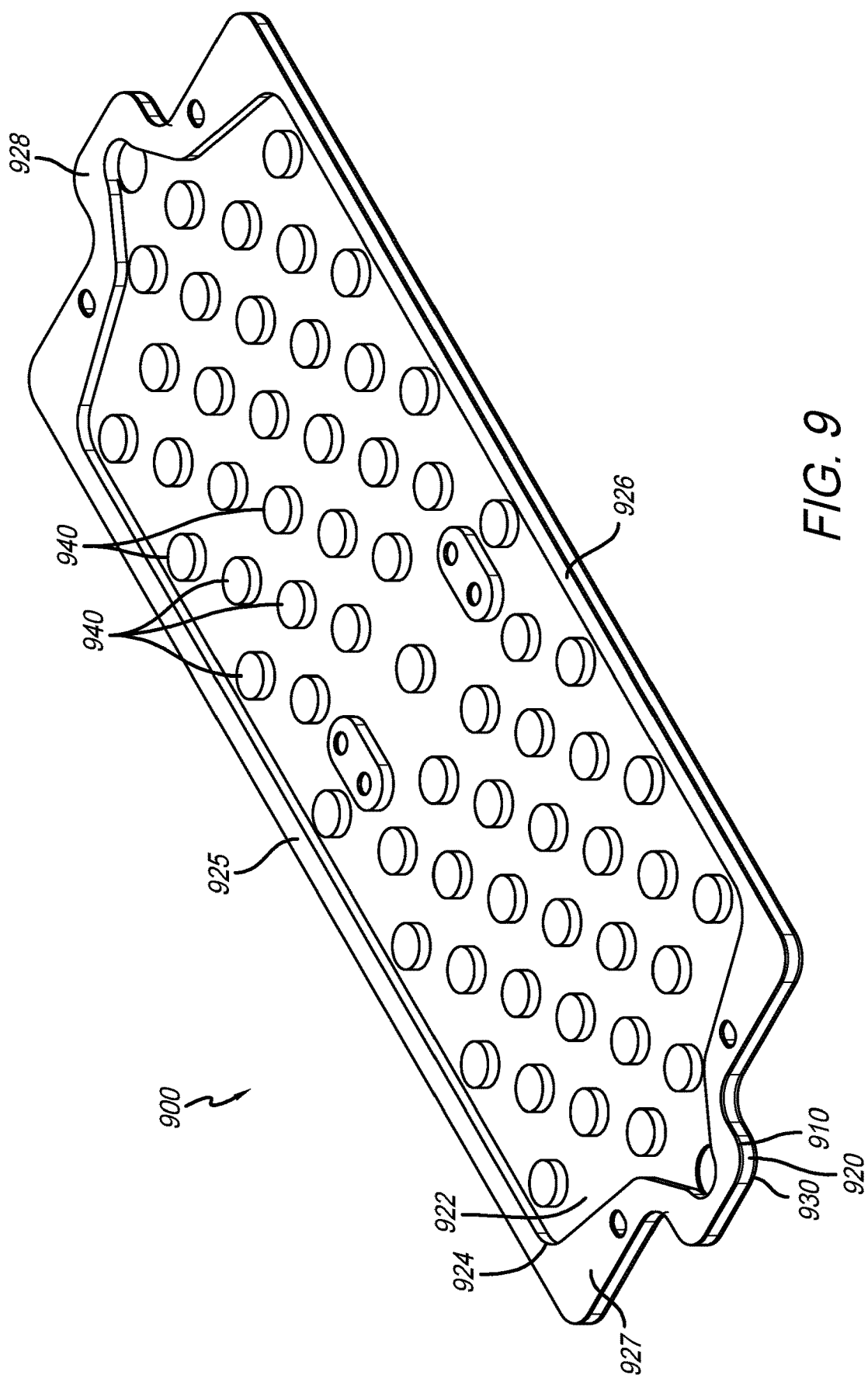
FIG. 9 is a perspective view of a cooling plate, having a single open coolant chamber with islands distributed throughout.

While embodiments such as that of FIG. 2 may provide a serpentine coolant channel cut to traverse the cooling plate within a middle sheet, in other embodiments the coolant path may be formed in alternative manners. For example, a middle sheet may be cut to form an open coolant chamber, optionally with flow modifying structures welded within it. FIG. 9 illustrates such an embodiment.

FIG. 9 illustrates a cooling plate 900 formed from a bottom layer 930, a middle layer 920, and a top layer 910. In FIG. 9, top layer 910 is shown as transparent to illustrate internal structures, although in typical real-world embodiments top layer 910 will be formed from aluminum or other metal comparable to top sheet 110 in the embodiment of FIG. 1. Similarly, the structure and composition of bottom layer 930 may be comparable to bottom sheet 130.

In cooling plate 900, coolant chamber 922 is formed in middle layer 920, preferably via laser cutting of a solid sheet of material around a chamber perimeter 924. Coolant chamber 922 preferably spans nearly the entire width of middle layer 920 (e.g. preferably at least 80% of the width of middle layer 920), leaving side portion 925 and side portion 926 to enclose the sides of coolant chamber 922. Similarly, coolant chamber 922 preferably spans nearly the entire length of middle layer 920 (e.g. preferably at least 80% of the length of middle layer 920), leaving end portion 927 and end portion 928 to enclose the ends of coolant chamber 922. Thus, coolant chamber 922 occupies a majority of area within the perimeter of middle layer 920.

A number of islands may be enclosed within coolant chamber 922 in order to, e.g., improve the structural integrity of cooling plate 900 and/or modify the flow of coolant through coolant chamber 922 during use. In the embodiment of cooling plate 900, islands 940 are distributed throughout coolant chamber 922. Islands 940 are cylindrical slugs of material, distributed throughout coolant chamber 922 in a polka dot pattern. Islands 940 are preferably formed from the same material and thickness as middle layer 920. In some embodiments, islands 940 may be cut from middle layer 920 during fabrication (e.g. from material originally within coolant chamber 922 before cutting around chamber perimeter 924 for removal).

Each island 940 is preferably laser-welded to top layer 910 on its topside, and bottom layer 930 on its bottom side. Islands 940 can therefore serve to stabilize top layer 910, middle layer 920 and bottom layer 930; resist crushing of 922 (e.g. resist compressive deformation of top layer 910 and bottom layer 930 inward toward one another); and resist outward expansion of coolant chamber 922 when coolant chamber 922 is pressurized with coolant.

Islands 940 may also improve fluid dynamics of coolant passive through coolant chamber 922. In particular, islands 940 may promote mixing of coolant, distribution of coolant throughout coolant chamber 922, and reduction of boundary layers within the coolant.

Figure 10:
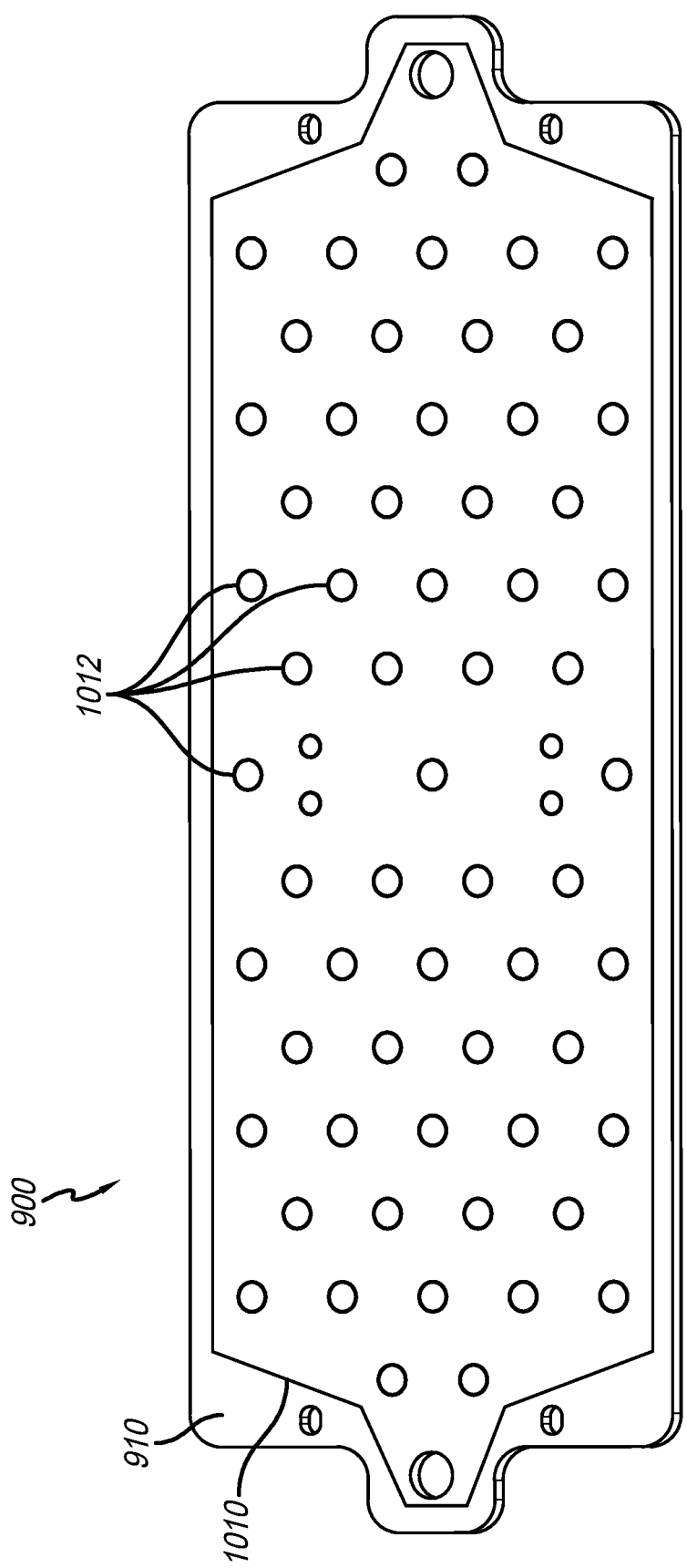
FIG. 10 is a top plan view of an assembled cooling plate, in accordance with the embodiment of FIG. 9.

FIG. 10 shows cooling plate 900 with top layer 910 present in metal, as constructed. Laser weld 1010 extends around an outer portion of cooling plate 900, preferably slightly outside chamber perimeter 924, thereby securing top layer 910 to middle layer 920 (and particularly, to side portion 925, side portion 926, end portion 927, and end portion 928). Circular welds 1012 each circumscribe a perimeter region of an island 940, securing each island 940 to top layer 910. Analogous perimeter and island welds are applied to a bottom side of cooling plate 900, to secure bottom layer 930 to middle layer 920 and islands 940.

Figure 11:
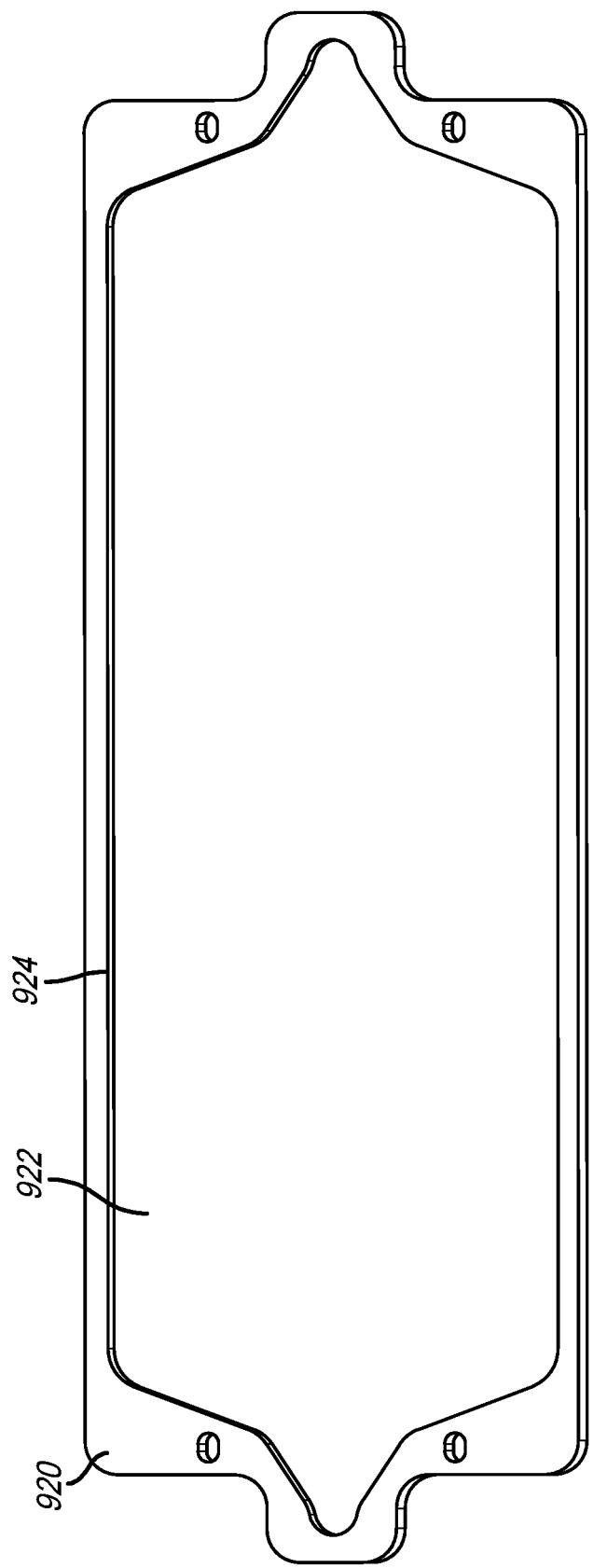
FIG. 11 is a perspective view of a middle layer.
Figure 12:
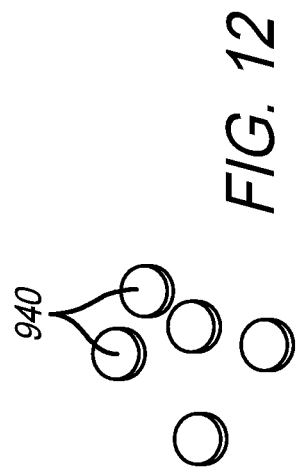
FIG. 12 is a perspective view of islands cut from a middle sheet of material, prior to installation within a coolant chamber.

FIG. 11 illustrates a top perspective view of middle layer 920, after chamber perimeter 924 has been cut to remove material and form coolant chamber 922. FIG. 12 illustrates multiple islands 940, after having been cut out from material removed during fabrication of middle layer 920 corresponding to coolant chamber 922, prior to installation of islands 940 in cooling plate 900.

Figure 13:
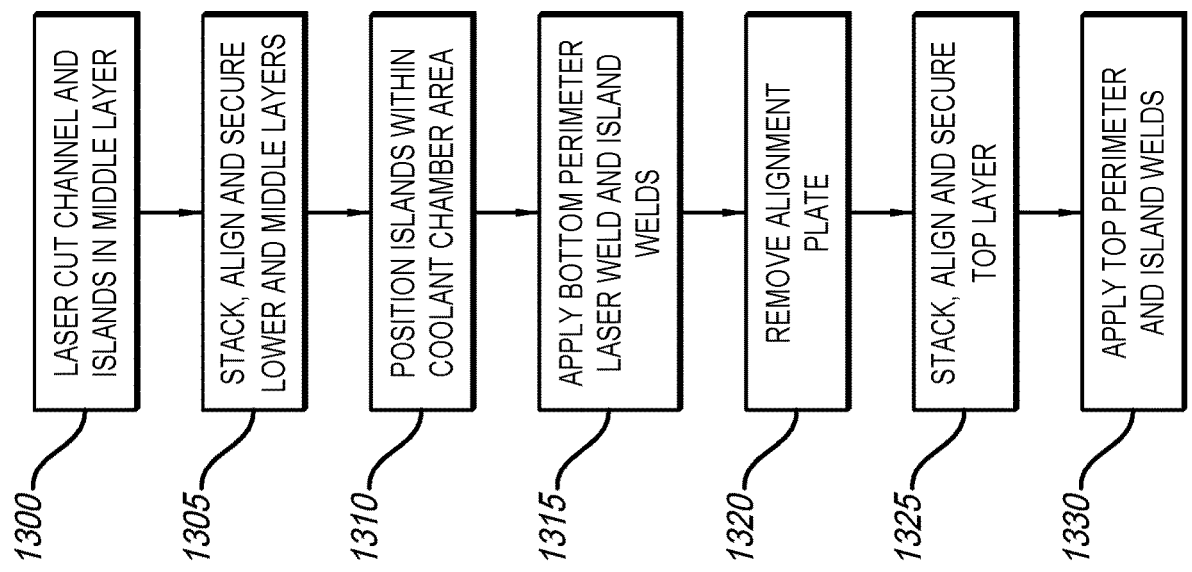
FIG. 13 is a flow chart illustrating a process for fabricating a coolant plate having an open coolant chamber with islands.

FIG. 13 is a process chart illustrating an exemplary method of fabricating cooling plate 900. In step S1300, a laser cutting machine operates on a solid middle layer 920 in order to (a) cut out a central portion of material to form coolant chamber 922; and (b) cut islands 940 from the central portion of material removed from coolant chamber 922. Remaining portions of material removed in step S1300 can be e.g. recycled.

In step S1305, bottom layer 930 and middle layer 920 are stacked, aligned at their edges, and secured together in the desired alignment using a pressure plate. In step S1310, islands 940 are positioned within coolant chamber 922, resting on a top side of bottom layer 930. Preferably, islands 940 are positioned by installing a removable alignment plate within coolant chamber 922, in order to temporarily hold islands 940 in desired positions.

Figure 14:
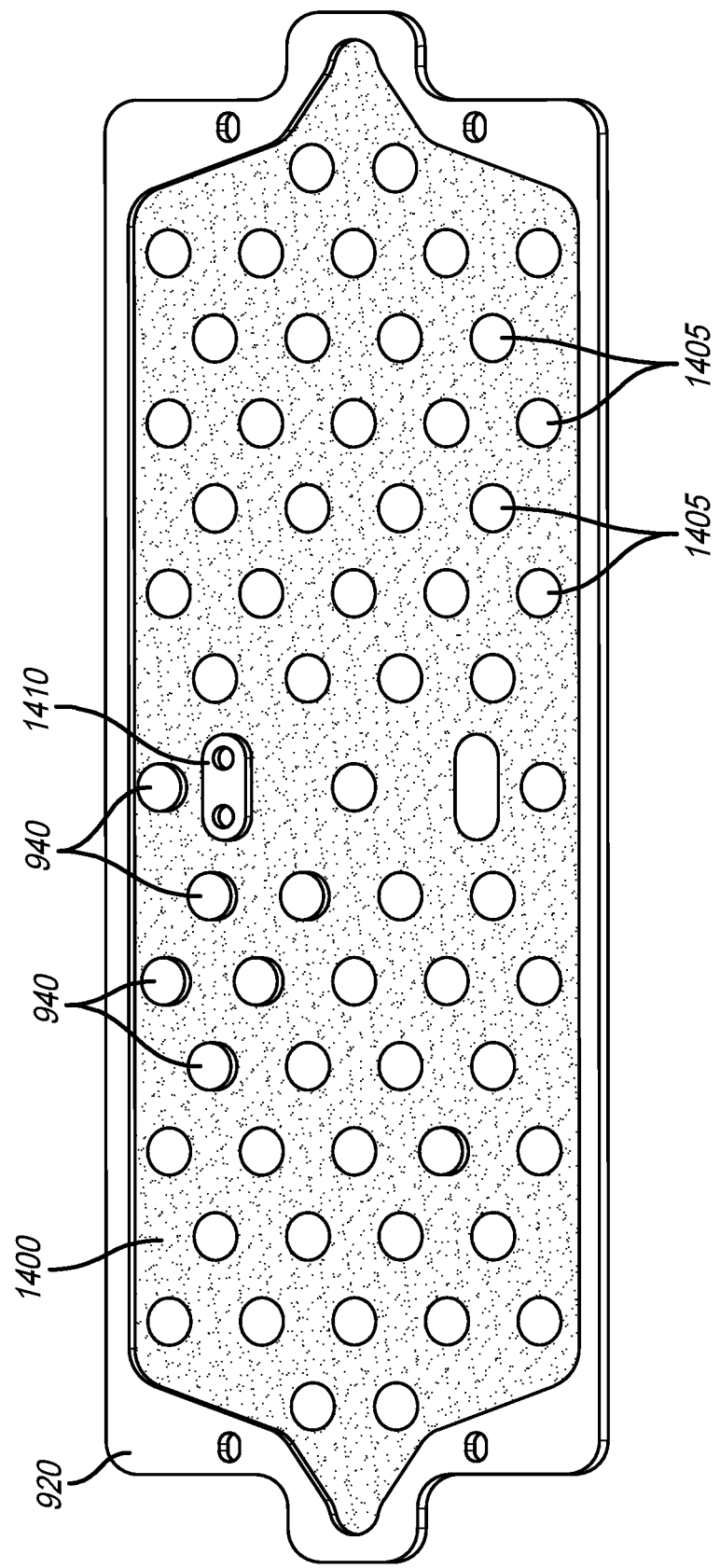
FIG. 14 is a perspective view of a cooling plate in accordance with FIG. 9, during installation of islands and mounting lugs within a middle layer coolant chamber.

FIG. 14 illustrates a top perspective view of cooling plate 900 during the course of fabrication in step S1310. Alignment plate 1400 is formed to fit within a cutout for coolant chamber 922 in middle layer 920, resting on a top side of bottom layer 930. Alignment plate 1400 includes numerous receptacles 1405 distributed throughout, each sized to fit one of islands 940. Once alignment plate 1400 is positioned, one of islands 940 may be inserted into each of receptacles 1405, to retain islands 940 in desired positions within coolant chamber 922.

Alignment plate 1400 may also be used to position mounting lugs, such as mounting lug 1410, within the middle layer. Mounting lug 1410 will be welded to the top and bottom layers, analogously to islands 940, but further include through holes to facilitate passage of mounting bolts or other positioning structures, passing through the assembled cooling plate 900. Preferably, mounting lug 1410 will be sufficiently large in cross section to underly any nut, bolthead or other structure that may be applied to e.g. a bolt passing through mounting lug 1410, thereby supporting top layer 910 and bottom layer 930 and preventing crushing of top layer 910 and/or bottom layer 930 inward into coolant chamber 922. Preferably, laser welds will be applied to secure top and bottom sheets to mounting lug 1410 around perimeter portions of mounting lug 1410, thereby preventing leakage of coolant.

Returning to the process of FIG. 12, in step S1315, a laser welder operates on a bottom side of cooling plate 900, applying a perimeter laser weld to join bottom layer 930 to middle layer 920 (analogous to laser weld 1010, but on the apparatus bottom side), and laser welds securing each of islands 940 to bottom layer 930 (analogous to circular welds 1012, but on the apparatus bottom side). In step S1320, for embodiments in which a alignment plate 1400 is utilized, and with islands 940 secured to bottom layer 930, alignment plate 1400 is removed from coolant chamber 922.

In step S1325, top layer 910 is stacked on top of, aligned with, and secured to middle layer 920 (e.g. using another pressure plate). In step S1330, top side laser welds (i.e. laser weld 1010 and circular welds 1012) are applied to top layer 910, forming a completed, unitary cooling plate 900.

While islands 940 are illustrated in the embodiment of FIGS. 9-14 as short cylindrical structures distributed within coolant chamber 922 in a polka dot pattern, in other embodiments, islands 940 may be formed having other shapes, whether uniform or even having varying shapes based, e.g., on the position of the islands within coolant chamber 922. However, preferably islands 940 will each have a height equal to the thickness of middle layer 920, to facilitate welding of each islands 940 to both top layer 910 and bottom layer 930, potentially increasing strength of the assembled cooling plate, resistance of top layer 910 and bottom layer 930 to outward deformation when coolant chamber 922 is under pressure, and ease of manufacture.

While references may be made herein throughout to portions of cooling plates being a top side or a bottom side, such references are relative and made for ease of understanding. It is contemplated and understood that in most embodiments, a reference to one side of a cooling plate as being "top" or "bottom" will be arbitrary, and not intended to state or suggest any particular orientation during fabrication, installation or use of the cooling plate. For example, in the process of FIG. 13, references a lower layer or bottom side in e.g. steps S1305, S1310, S1315, may refer to a side and layer that is ultimately facing upward when the resulting cooling plate is installed for use in a larger apparatus. Similarly, references to a top layer or top side in e.g. steps S1325, S1330, may refer to a side and layer that is ultimately facing downward when the resulting cooling plate is installed for use in a larger apparatus. In some instances, top and bottom sides may instead be referred to as first and second sides.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure. Moreover, although the techniques have been described in language specific to structural features and/or methodological acts, it is to be understood that the appended claims are not necessarily limited to the features or acts described. Rather, the features and acts are described as example implementations of such techniques.

Conditional language such as, among others, "can," "could," "might" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be either X, Y, or Z, or a combination thereof.

Furthermore, the description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

It will also be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

The invention claimed is:

1. A method for manufacturing a cooling plate from a top sheet, a middle sheet, and a bottom sheet, comprising:
    forming an open channel through a middle sheet of flat solid material, the open channel passing from a top side of the middle sheet through to a bottom side of the middle sheet, by laser cutting and removal of a portion of the middle sheet corresponding to the open channel;
    stacking within a fabrication fixture a top sheet of flat solid material on the top side of the middle sheet, and a bottom sheet of flat solid material on the bottom side of the middle sheet, such that the top sheet and the bottom sheet enclose the open channel and directly contact the middle sheet;
    applying a plurality of laser welds to the stacked sheets, forming:
        a top side perimeter laser weld around a circumference of the cooling plate to secure the top sheet to the middle sheet,
        a bottom side perimeter laser weld around a circumference of the cooling plate to secure the bottom sheet to the middle sheet,
        a top side channel laser weld around a circumference of the open channel to secure the top sheet to the middle sheet, and
        a bottom side channel laser weld around a circumference of the open channel to secure the bottom sheet to the middle sheet.

2. The method of claim 1, wherein the top sheet, the middle sheet and the bottom sheet consist of aluminum.

3. The method of claim 1, wherein the fabrication fixture comprises a pressure plate and clamps, and wherein the step of stacking comprises using the clamps to compress the stacked top sheet, middle sheet and bottom sheet against the pressure plate.

4. The method of claim 3, in which the pressure plate is comprised of aluminum, whereby the pressure plate sinks thermal energy from the cooling plate during the step of applying a plurality of laser welds.

5. The method of claim 1, wherein the step of stacking further comprises inserting one or more coolant flow modifier components within the middle sheet open channel.

6. The method of claim 1, in which the step of applying a plurality of laser welds comprises applying the top side perimeter laser weld to form a weld that is continuous around an entire circumference of the cooling plate; and applying the bottom side perimeter laser weld to form a weld that is continuous around an entire circumference of the cooling plate.

7. The method of claim 6, in which the top side perimeter laser weld and the bottom side perimeter laser weld are applied in multiple overlapping sections.

8. The method of claim 1, in which the step of applying a plurality of laser welds comprises applying the top side channel laser weld to form a weld that is continuous around an entire circumference of the open channel; and applying the bottom side channel laser weld to form a weld that is continuous around an entire circumference of the open channel.

9. The method of claim 8, in which the top side channel laser weld and the bottom side channel laser weld are applied in multiple overlapping sections.

10. The method of claim 1, further comprising forming apertures within the top sheet for an inlet port providing communication between a first end of the open channel and an area outside the cooling plate, and for an outlet port providing communication between a second end of the open channel and an area outside the cooling plate.

11. The method of claim 1, wherein the top sheet comprises an inlet aperture exposing a first end of the open channel, the method further comprising: welding an inlet port to the top sheet over the inlet aperture.

12. The method of claim 11, wherein the top sheet further comprises an outlet aperture exposing a second end of the open channel, the method further comprising: welding an outlet port to the top sheet over the outlet aperture.

13. The method of claim 1, wherein the step of stacking further comprises inserting a sensor assembly within the middle sheet open channel.

14. The method of claim 1, further comprising forming apertures aligned with one another in the top sheet, middle sheet and bottom sheet which do not expose any portion of the open channel, for mounting of the cooling plate to a device.

15. The method of claim 1, wherein the step of applying a plurality of laser welds comprises:
    mounting the stacked top sheet, middle sheet and bottom sheet within the fabrication fixture against a first pressure plate while forming a top side perimeter laser weld around a circumference of the cooling plate to secure the top sheet to the middle sheet, and while forming a bottom side perimeter laser weld around a circumference of the cooling plate to secure the bottom sheet to the middle sheet; and
    mounting the stacked top sheet, middle sheet and bottom sheet within the fabrication fixture against a second pressure plate while forming a top side channel laser weld around a circumference of the open channel to secure the top sheet to the middle sheet, and while forming a bottom side channel laser weld around a circumference of the open channel to secure the bottom sheet to the middle sheet;
    where the first pressure plate and the second pressure plate expose different portions of the stacked top sheet, middle sheet and bottom sheet to a laser welding apparatus.

* * * * *